United States Patent
Essawy et al.

(10) Patent No.: US 11,930,563 B2
(45) Date of Patent: Mar. 12, 2024

(54) MONITORING AND EXTENDING HEATER LIFE THROUGH POWER SUPPLY POLARITY SWITCHING

(71) Applicant: Rosemount Aerospace Inc., Burnsville, MN (US)

(72) Inventors: Magdi A. Essawy, Lakeville, MN (US); Cuong Tho Huynh, Eagan, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 906 days.

(21) Appl. No.: 16/572,200

(22) Filed: Sep. 16, 2019

(65) Prior Publication Data

US 2021/0084718 A1    Mar. 18, 2021

(51) Int. Cl.
| | |
|---|---|
| *H05B 3/00* | (2006.01) |
| *G01F 1/46* | (2006.01) |
| *G01M 3/40* | (2006.01) |
| *G01R 31/50* | (2020.01) |
| *H01H 1/62* | (2006.01) |
| *H05B 3/28* | (2006.01) |

(52) U.S. Cl.
CPC ............ *H05B 3/0014* (2013.01); *G01F 1/46* (2013.01); *G01M 3/40* (2013.01); *G01R 31/50* (2020.01); *H01H 1/62* (2013.01); *H05B 3/28* (2013.01)

(58) Field of Classification Search
CPC .......... H01H 1/62; H05B 3/0014; H05B 3/28; G01R 31/50; G01F 1/46; G01M 3/40
See application file for complete search history.

(56) References Cited

U.S. PATENT DOCUMENTS

| | | |
|---|---|---|
| 3,795,652 A | 3/1974 | Sakamoto et al. |
| 3,798,652 A | 3/1974 | Williams |
| 4,121,088 A | 10/1978 | Doremus et al. |
| 4,207,566 A | 6/1980 | Gitlin et al. |
| 4,267,721 A | 5/1981 | Longenecker et al. |
| 4,506,259 A | 3/1985 | Rhodes |
| 4,698,583 A | 10/1987 | Sandberg |
| 5,130,652 A | 7/1992 | Kawakami et al. |

(Continued)

FOREIGN PATENT DOCUMENTS

| | | |
|---|---|---|
| CA | 1311028 | 5/1989 |
| CN | 1330766 A | 1/2002 |

(Continued)

OTHER PUBLICATIONS

Machine translation of JP-H0720577: Machida, To provide a leakage current measuring device, 1993 (Year: 1993).*

(Continued)

*Primary Examiner* — Janie M Loeppke
*Assistant Examiner* — Abigail H Rhue
(74) *Attorney, Agent, or Firm* — Kinney & Lange, P.A.

(57) ABSTRACT

A method and system for monitoring a heating arrangement includes applying a first polarity voltage to a heater of the heating arrangement, detecting a first polarity heating leakage current, applying a second polarity voltage to the heating arrangement, detecting a second polarity heating leakage current, and determining health of the heating arrangement via the first polarity heating leakage current and the second polarity heating leakage current.

18 Claims, 8 Drawing Sheets

(56) References Cited

U.S. PATENT DOCUMENTS

| | | | |
|---|---|---|---|
| 5,216,226 A | 6/1993 | Miyoshi | |
| 5,218,294 A | 6/1993 | Soiferman | |
| 5,464,965 A | 11/1995 | McGregor et al. | |
| 5,767,781 A | 6/1998 | Yavelberg | |
| 5,883,512 A | 3/1999 | Streit et al. | |
| 5,942,682 A | 8/1999 | Ghetzler et al. | |
| 5,986,444 A | 11/1999 | Powell | |
| 6,070,475 A | 6/2000 | Muehlhauser et al. | |
| 6,107,611 A | 8/2000 | Jones | |
| 6,151,560 A | 11/2000 | Jones | |
| 6,188,423 B1 | 2/2001 | Pou | |
| 6,218,647 B1 | 4/2001 | Jones | |
| 6,266,219 B1 | 7/2001 | Macbeth et al. | |
| 6,270,460 B1 | 8/2001 | McCartan et al. | |
| 6,300,767 B1 | 10/2001 | Kliman et al. | |
| 6,336,083 B1 | 1/2002 | Lanham et al. | |
| 6,370,450 B1 | 4/2002 | Kromer et al. | |
| 6,400,334 B1 | 6/2002 | Lindenmeier et al. | |
| 6,414,282 B1 | 7/2002 | Ice et al. | |
| 6,414,508 B1 | 7/2002 | London | |
| 6,430,996 B1 | 8/2002 | Anderson et al. | |
| 6,476,624 B1 | 11/2002 | Chuman et al. | |
| 6,543,298 B2 | 4/2003 | Cronin et al. | |
| 6,560,551 B1 | 5/2003 | Severson et al. | |
| 6,668,640 B1 | 12/2003 | Alwin et al. | |
| 6,759,962 B2 | 7/2004 | Severson et al. | |
| 6,906,537 B2 | 6/2005 | Goldberg et al. | |
| 7,012,538 B2 | 3/2006 | Peck et al. | |
| 7,193,428 B1 | 3/2007 | Baron et al. | |
| 7,202,451 B2 | 4/2007 | Uchida et al. | |
| 7,209,651 B1 | 4/2007 | Knoeppel et al. | |
| 7,219,023 B2 | 5/2007 | Banke et al. | |
| 7,256,372 B2 * | 8/2007 | Knoeppel | F24H 9/2021 219/486 |
| 7,490,510 B2 | 2/2009 | Agami et al. | |
| 7,647,843 B2 | 1/2010 | Burton | |
| 7,854,548 B2 | 12/2010 | Sandnas et al. | |
| 7,915,567 B2 | 3/2011 | Lhuillier | |
| 8,182,143 B2 | 5/2012 | Fleming et al. | |
| 8,269,513 B2 | 9/2012 | Palm et al. | |
| 8,466,390 B2 | 6/2013 | Gaertner et al. | |
| 8,711,008 B2 | 4/2014 | Cook et al. | |
| 8,890,703 B2 | 11/2014 | Farris et al. | |
| 9,046,899 B2 | 6/2015 | Shearer et al. | |
| 9,080,917 B2 | 7/2015 | Nguyen et al. | |
| 9,463,879 B2 | 10/2016 | Khozikov et al. | |
| 9,638,436 B2 * | 5/2017 | Arensmeier | G05B 15/02 |
| 9,654,054 B1 | 5/2017 | Omoumi et al. | |
| 9,733,135 B2 | 8/2017 | Feau et al. | |
| 9,885,761 B2 | 2/2018 | Schram | |
| 9,919,812 B2 | 3/2018 | Shi | |
| 9,927,480 B2 | 3/2018 | Nesnidal | |
| 9,939,459 B2 | 4/2018 | Dichek | |
| 10,132,824 B2 | 11/2018 | Benning et al. | |
| 10,151,785 B2 | 12/2018 | Essawy et al. | |
| 10,180,449 B2 | 1/2019 | Essawy et al. | |
| 10,197,517 B2 | 2/2019 | Essawy et al. | |
| 10,564,203 B2 | 2/2020 | Essawy et al. | |
| 11,060,992 B2 * | 7/2021 | Fok | G05B 15/02 |
| 2001/0054611 A1 | 12/2001 | Miyahara et al. | |
| 2002/0078752 A1 | 6/2002 | Braunling et al. | |
| 2002/0154029 A1 | 10/2002 | Watt et al. | |
| 2003/0169031 A1 | 9/2003 | Viola | |
| 2003/0206111 A1 | 11/2003 | Gao et al. | |
| 2004/0024538 A1 | 2/2004 | Severson et al. | |
| 2004/0032270 A1 | 2/2004 | Goldberg et al. | |
| 2004/0075567 A1 | 4/2004 | Peck et al. | |
| 2004/0124358 A1 | 7/2004 | Okamura et al. | |
| 2004/0217106 A1 | 11/2004 | Giterman | |
| 2004/0243949 A1 | 12/2004 | Wang et al. | |
| 2005/0200363 A1 | 9/2005 | Hasegawa et al. | |
| 2005/0231153 A1 | 10/2005 | Dewey et al. | |
| 2005/0232331 A1 | 10/2005 | Severson | |
| 2005/0232332 A1 | 10/2005 | Hanson et al. | |
| 2006/0033504 A1 | 2/2006 | Barber et al. | |
| 2006/0096971 A1 | 5/2006 | Reusche et al. | |
| 2006/0133447 A1 | 6/2006 | Severson | |
| 2006/0250143 A1 | 11/2006 | Moon et al. | |
| 2007/0084857 A1 | 4/2007 | Osaka | |
| 2007/0125764 A1 | 6/2007 | Knoeppel et al. | |
| 2007/0208520 A1 | 9/2007 | Zhang et al. | |
| 2008/0018340 A1 | 1/2008 | Amou et al. | |
| 2008/0112100 A1 | 5/2008 | Liu | |
| 2008/0147255 A1 | 6/2008 | Alwin et al. | |
| 2008/0151963 A1 | 6/2008 | Sandnas et al. | |
| 2008/0183404 A1 | 7/2008 | Emami et al. | |
| 2008/0250796 A1 | 10/2008 | Clugston et al. | |
| 2009/0003408 A1 | 1/2009 | Severson | |
| 2009/0055036 A1 | 2/2009 | Vozhdaev et al. | |
| 2009/0065502 A1 | 3/2009 | Suenaga et al. | |
| 2009/0251152 A1 | 10/2009 | Ammann | |
| 2009/0321415 A1 | 12/2009 | Zhang et al. | |
| 2010/0108662 A1 | 5/2010 | Taylor et al. | |
| 2010/0156426 A1 | 6/2010 | Kang et al. | |
| 2010/0163433 A1 | 7/2010 | Horn | |
| 2010/0213960 A1 | 8/2010 | Mok et al. | |
| 2010/0231249 A1 | 9/2010 | Dang et al. | |
| 2011/0036160 A1 | 2/2011 | Pineau et al. | |
| 2011/0058397 A1 | 3/2011 | Rizzo | |
| 2011/0089958 A1 | 4/2011 | Malecki et al. | |
| 2011/0106475 A1 | 5/2011 | Wigen | |
| 2011/0118990 A1 | 5/2011 | Sidhu et al. | |
| 2011/0290784 A1 | 12/2011 | Orawetz et al. | |
| 2011/0320139 A1 | 12/2011 | Amir et al. | |
| 2012/0133384 A1 | 5/2012 | Palais et al. | |
| 2012/0213246 A1 | 8/2012 | Honbo et al. | |
| 2012/0268074 A1 | 10/2012 | Cooley et al. | |
| 2012/0319706 A1 | 12/2012 | Nadel et al. | |
| 2013/0037535 A1 | 2/2013 | Ogasawara | |
| 2013/0039565 A1 | 2/2013 | Takeshima et al. | |
| 2013/0194101 A1 | 8/2013 | Devupalli | |
| 2013/0314082 A1 | 11/2013 | Lee et al. | |
| 2014/0033175 A1 | 1/2014 | Lee et al. | |
| 2014/0103938 A1 | 4/2014 | Jones et al. | |
| 2014/0238968 A1 | 8/2014 | Lee | |
| 2014/0245830 A1 | 9/2014 | Martin et al. | |
| 2014/0331751 A1 | 11/2014 | Macdonald | |
| 2015/0014303 A1 | 1/2015 | Kohler et al. | |
| 2015/0042980 A1 | 2/2015 | Liu et al. | |
| 2015/0055940 A1 | 2/2015 | Steinhauser | |
| 2015/0104888 A1 | 4/2015 | Lee | |
| 2015/0123688 A1 | 5/2015 | Sappok et al. | |
| 2015/0142343 A1 | 5/2015 | Zach et al. | |
| 2015/0160148 A1 | 6/2015 | Stanley | |
| 2015/0174843 A1 | 6/2015 | Crepin et al. | |
| 2015/0237680 A1 | 8/2015 | Ono et al. | |
| 2016/0013169 A1 | 1/2016 | Standing | |
| 2016/0054233 A1 | 2/2016 | Bense et al. | |
| 2016/0084986 A1 | 3/2016 | Zach et al. | |
| 2016/0131690 A1 | 5/2016 | Ueno et al. | |
| 2016/0131691 A1 | 5/2016 | Nesnidal | |
| 2016/0178221 A1 | 6/2016 | Thornton et al. | |
| 2016/0178680 A1 | 6/2016 | Ntziachristos | |
| 2016/0255184 A1 | 9/2016 | Hwang | |
| 2016/0280391 A1 | 9/2016 | Golly et al. | |
| 2016/0291051 A1 | 10/2016 | Golly et al. | |
| 2016/0313259 A1 | 10/2016 | Shayovitz | |
| 2016/0338569 A1 | 11/2016 | Reder et al. | |
| 2016/0364629 A1 | 12/2016 | Solli | |
| 2016/0377487 A1 | 12/2016 | Cheung et al. | |
| 2017/0016947 A1 | 1/2017 | Polzer | |
| 2017/0037090 A1 | 2/2017 | Richmond et al. | |
| 2017/0099699 A1 | 4/2017 | Nosrati et al. | |
| 2017/0110887 A1 | 4/2017 | Bell et al. | |
| 2017/0115139 A1 | 4/2017 | Wong et al. | |
| 2017/0167925 A1 | 6/2017 | Safai et al. | |
| 2017/0182447 A1 | 6/2017 | Sappok et al. | |
| 2017/0191875 A1 | 7/2017 | Schmidt et al. | |
| 2017/0215936 A1 | 8/2017 | Wallace | |
| 2017/0259927 A1 | 9/2017 | Schram | |
| 2017/0273142 A1 | 9/2017 | Denis et al. | |
| 2017/0299626 A1 | 10/2017 | Dichek | |
| 2017/0336156 A1 | 11/2017 | Phillips | |
| 2017/0343418 A1 | 11/2017 | Hurbi et al. | |

(56) References Cited

U.S. PATENT DOCUMENTS

| | | | |
|---|---|---|---|
| 2017/0370748 | A1 | 12/2017 | Fuller |
| 2017/0370960 | A1 | 12/2017 | Benning et al. |
| 2017/0374296 | A1 | 12/2017 | Schmidt |
| 2018/0026550 | A1 | 1/2018 | Dent |
| 2018/0037338 | A1 | 2/2018 | Shi |
| 2018/0123441 | A1 | 5/2018 | Yanai |
| 2018/0183404 | A1 | 6/2018 | Jourdan et al. |
| 2018/0197350 | A1 | 7/2018 | Kim et al. |
| 2018/0275080 | A1 | 9/2018 | Essawy et al. |
| 2018/0275085 | A1 | 9/2018 | Fok et al. |
| 2018/0275181 | A1 | 9/2018 | Essawy et al. |
| 2018/0275182 | A1 | 9/2018 | Essawy et al. |
| 2018/0275183 | A1 | 9/2018 | Essawy et al. |
| 2018/0275184 | A1 | 9/2018 | Essawy et al. |
| 2018/0275185 | A1 | 9/2018 | Essawy et al. |
| 2018/0290756 | A1 | 10/2018 | White et al. |
| 2019/0297675 | A1 | 9/2019 | Vadgaonkar et al. |
| 2019/0382139 | A1 | 12/2019 | Shi |
| 2020/0011761 | A1 | 1/2020 | Pado |
| 2020/0063682 | A1 | 2/2020 | Boelke |
| 2020/0191851 | A1 | 6/2020 | Essawy et al. |
| 2020/0340889 | A1 | 10/2020 | Mlcak et al. |
| 2020/0391871 | A1 | 12/2020 | Essawy et al. |

FOREIGN PATENT DOCUMENTS

| | | | | |
|---|---|---|---|---|
| CN | 101696986 | A | | 4/2010 |
| CN | 104296957 | A | | 1/2015 |
| CN | 105092050 | A | | 11/2015 |
| CN | 109246868 | A | | 1/2019 |
| CN | 109521252 | A | | 3/2019 |
| DE | 19833454 | A1 | * 2/2000 | ........... G01N 27/124 |
| EP | 1441429 | A1 | | 7/2004 |
| EP | 2755443 | A2 | | 7/2014 |
| EP | 3018057 | A1 | | 5/2016 |
| EP | 3281874 | A1 | | 2/2018 |
| EP | 3379265 | A1 | | 9/2018 |
| EP | 3379266 | A1 | | 9/2018 |
| EP | 3745141 | A1 | | 12/2020 |
| GB | 809608 | | | 2/1959 |
| GB | 809608 | A | | 2/1959 |
| GB | 884415 | A | | 11/1961 |
| GB | 0884415 | | | 12/1961 |
| GB | 2561393 | B | | 12/2019 |
| JP | H0720577 | U | * 9/1993 | |
| JP | 2006088391 | A | | 4/2006 |
| JP | 20121968123 | A | | 10/2012 |
| KR | 20110124542 | A | | 11/2011 |
| KR | 101110789 | B1 | | 2/2012 |
| KR | 20120062301 | A | | 6/2012 |
| WO | 09011532 | A1 | | 10/1990 |
| WO | 09816837 | A1 | | 4/1998 |
| WO | 9943066 | A1 | | 8/1999 |
| WO | 2011026740 | A1 | | 3/2011 |
| WO | 2013107371 | A1 | | 7/2013 |

OTHER PUBLICATIONS

Machine translation of DE-19833454: Bausewein, Method for reducing drift behavior in resistive high-temperature gas sensors and device for carrying out the method, 2000 (Year: 2000).*
Extended European Search Report dated Sep. 1, 2021 for corresponding European Application No. 21169946.7, seven pages.
Extended European Search Report dated Jul. 26, 2021, received for corresponding European Application No. 21164413.3, eight pages.
Extended European Search Report for European Patent Application No. 19213783.4, dated Jun. 23, 2020, 7 pages.
Extended European Search Report for European Patent Application No. 19216276.6, dated Jul. 6, 2020, 10 pages.
Bechhoefer, John, et al. "Temperature Dependence of the Capacitance of a Ferroelectric Material." in: American Journal of Physics (2007), vol. 75, No. 11, pp. 1046-1053.
Extended European Search Report for European Patent Application No. 18153822.4, dated May 17, 2018, 9 pages.
Communication Pursuant to Article 94(3) EPC for European Patent Application No. 18153822.4, dated Jan. 16, 2020, 4 pages.
Extended European Search Report for European Patent Application No. 18153825.7, dated Apr. 9, 2018, 7 pages.
Extended European Search Report for European Patent Application No. 19207401.1, dated Jan. 27, 2020, 8 pages.
Extended European Search Report for European Patent Application No. 18153830.7, dated May 23, 2018, 9 pages.
Extended European Search Report for European Patent Application No. 18153832.3, dated May 24, 2018, 9 pages.
Extended European Search Report for European Patent Application No. 19205621.6, dated Nov. 22, 2019, 9 pages.
Extended European Search Report for European Patent Application No. 18153834.9, dated May 29, 2018, 9 pages.
Extended European Search Report for European Patent Application No. 19203208.4, dated Nov. 18, 2019, 7 pages.
Extended European Search Report for European Patent Application No. 18153824.0, dated May 17, 2018, 9 pages.
Communication Pursuant to Article 94(3) EPC for European Patent Application No. 18153824.0, dated Jun. 12, 2019, 7 pages.
Communication Pursuant to Article 94(3) EPC for European Patent Application No. 18153824.0, dated Jan. 16, 2020, 5 pages.
Extended European Search Report for European Patent Application No. 18162251.5, dated Jul. 5, 2018, 9 pages.
Communication Pursuant to Article 94(3) EPC for European Patent Application No. 18162251.5, dated Jun. 12, 2019, 3 pages.
Cedric Gillet and Andreas Freidrich, "Guidelines for Designing a Concentrator for High-Current Sensing Applications with an Allegro Hall-Effect Sensor IC", 2013, 7 pages.
Magnetics Division of Sprang & Company, Technical Bulletin "Magnetic Cores for Hall Effect Devices", 1997, 6 pages.
Extended European Search Report dated May 4, 2020, received for corresponding European application No. 19214929.2, 40 pages.
S. Taheri, M. Farzaneh and I. Fofana, Equivalent Surface Conductivity of Ice Accumulated on Insulators during Development of AC and DC Flashovers Arcs, IEEE Transactions on Dielectrics and Electrical Insulation, vol. 20, No. 5; Oct. 2013, pp. 10.
Extended European Search Report dated Jul. 3, 2020, received for corresponding European Application No. 19215831.9, 12 pages.
European Examination Report dated Jul. 6, 2023, received for corresponding European Application No. 21164413.3, pp. 6.
Extended European Search Report for European Patent Application No. 19216159.4, dated May 28, 2020. 9 pages.
Chen, L. , et al., "Double-Coupled Systems for IPT Roadway Applications", L. Chen, G. R. Nagendra, J. T. Boys and G. A. Covic, "Double-Coupled Systems for IPT Roadway Applications," in IEEE Journal of Emerging and Selected Topics in Power Electronics, vol. 3, No. 1, pp. 37-49, Mar. 2015, doi: 10.1109/JESTPE.2014. 2325943., Mar. 2015, 37-49.
Lu, P. , et al., "Real-Time Monitoring of Temperature Rises of Energized Transformer Cores With Distributed Optical Fiber Sensors", P. Lu et al., "Real-Time Monitoring of Temperature Rises of Energized Transformer Cores With Distributed Optical Fiber Sensors," in IEEE Transactions on Power Delivery, vol. 34, No. 4, pp. 1588-1598, Aug. 2019, doi: 10.1109/TPWRD.2019.2912866., Aug. 2019.
Miller, J. M., et al., "lements of Wireless Power Transfer Essential to High Power Charging of Heavy Duty Vehicles", J. M. Miller and A. Daga, "Elements of Wireless Power Transfer Essential to High Power Charging of Heavy Duty Vehicles," in IEEE Transactions on Transportation Electrification, vol. 1, No. 1, pp. 26-39, Jun. 2015, doi: 10.1109/TTE.2015.2426500., Jun. 2015, 26-39.
Trigui, A. , et al., "Generic Wireless Power Transfer and Data Communication System Based on a Novel Modulation Technique", A. Trigui et al., "Generic Wireless Power Transfer and Data Communication System Based on a Novel Modulation Technique," in IEEE Transactions on Circuits and Systems I: Regular Papers, vol. 67, No. 11, pp. 3978-3990, Nov. 2020,, Nov. 2020, 3978-3990.
Communication Under Rule 71(3) EPC dated Jan. 5, 2024, for corresponding European Application No. 19215831.9.

(56) References Cited

OTHER PUBLICATIONS

First Chinese Office Action dated Dec. 29, 2023, for corresponding Chinese Application No. 201911285610.X.

* cited by examiner

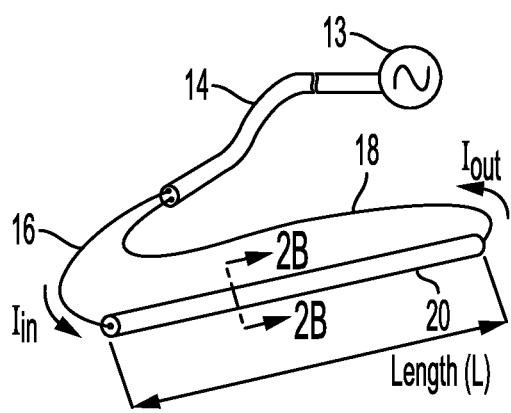
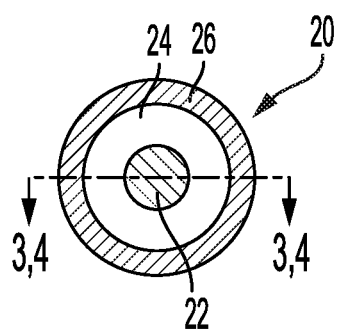
FIG. 2A
FIG. 2B
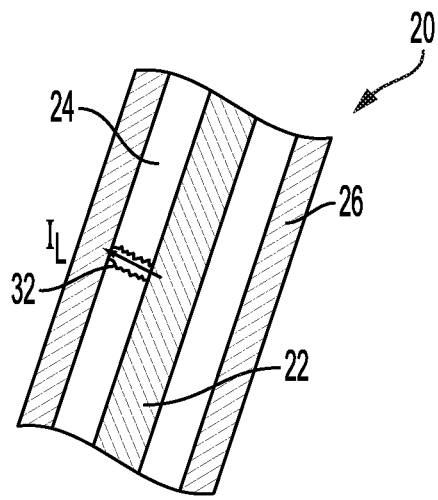
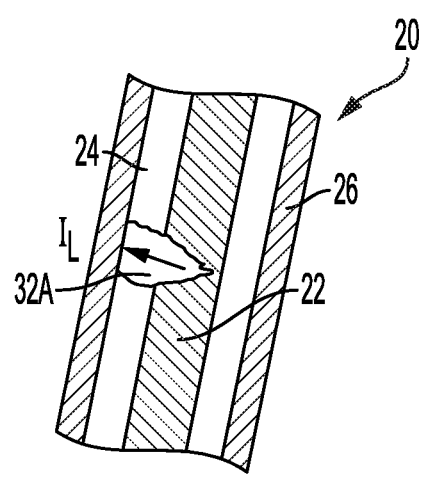
FIG. 3
FIG. 4

MONITORING AND EXTENDING HEATER LIFE THROUGH POWER SUPPLY POLARITY SWITCHING

BACKGROUND

The present disclosure relates generally to probes, and in particular, to a monitoring and life-extension system for air data probe heaters.

Probes are utilized to determine characteristics of an environment. In aircraft systems, for example, air data probes may be implemented on the external portions of the aircraft to aid in determination of conditions such as airspeed, altitude, and angle of attack, among others. Air data probes are prone to ice accretion during flight, which can affect their performance. Accordingly, electrical heaters are integrated into modern air data probes for helping control ice build-up. Being exposed to harsh environmental conditions and temperature extremes, the electric heaters in air data probes are prone to degradation over time, possibly leading to their ultimate failure. When an air data probe heater fails, the performance of the air data probe can be affected. Moreover, a failed air data probe can ground a flight, thereby impacting flight scheduling. It is desirable to be able to monitor the health of an air data probe heater, to help predict when the air data probe heater will require replacement which can mitigate the aforementioned impact on an aircraft's operation. It is also desirable to be able to extend the operational life of an air data probe heater, thereby reducing the time and cost associated with replacing air data probes.

SUMMARY

A method of monitoring a heating arrangement includes applying a first polarity voltage to a heater of the heating arrangement, detecting a first polarity heating leakage current, applying a second polarity voltage to the heating arrangement, detecting a second polarity heating leakage current, and determining health of the heating arrangement via the first polarity heating leakage current and the second polarity heating leakage current.

A heating arrangement monitoring system includes a leakage current measurement circuit configured to measure a heating leakage current, where the heating leakage current is either a first polarity heating leakage current as a result of applying a first polarity voltage to the heating arrangement or a second polarity heating leakage current as a result of applying a second polarity voltage to the heating arrangement, and a processor configured to determine a health of the heating arrangement based on one or more measured values of the first polarity heating leakage current and the second polarity heating leakage current.

BRIEF DESCRIPTION OF THE DRAWINGS

FIG. 2A is a schematic diagram of an air data probe heater circuit.

FIG. 2B is a cross-sectional view of the air data probe heater taken along line 2B-2B of FIG. 2A.

FIG. 3 is a partial cross-sectional view illustrating the air data probe heater with compromised insulation taken along line 3-3 of FIG. 2B.

FIG. 4 is a partial cross-sectional view illustrating the air data probe heater with compromised insulation and a compromised resistive heating element taken along line 4-4 of FIG. 2B.

DETAILED DESCRIPTION

Figure 1:
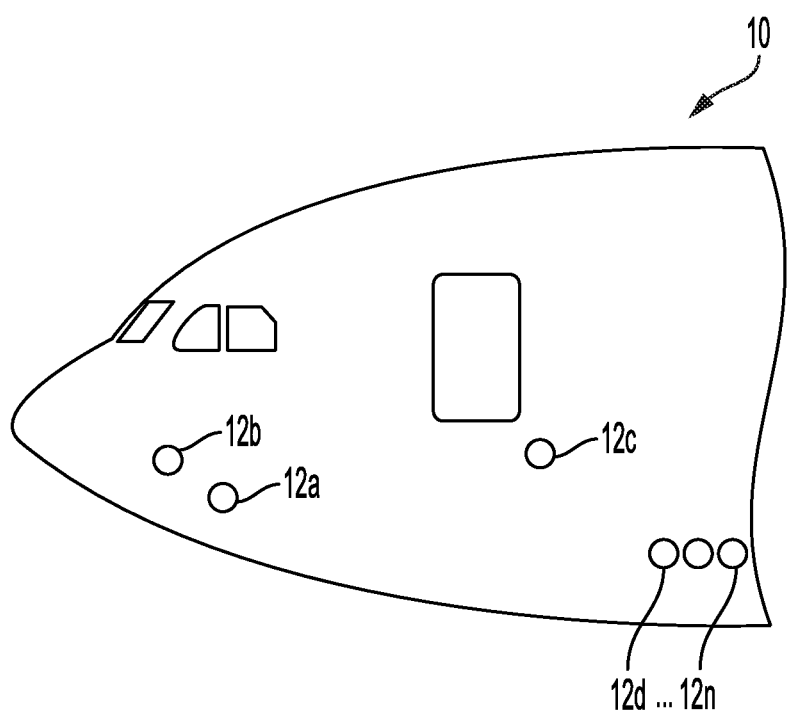
FIG. 1 is a schematic diagram illustrating an aircraft that includes a plurality of air data probes.

FIG. 1 is a schematic diagram illustrating aircraft 10 that includes a plurality of air data probes 12a-12n. Air data probes 12a-12n can be any type of probe with non-limiting examples including pitot probes, pitot-static probes, total air temperature (TAT) probes, or angle-of-attack (AOA) sensors. Any number n of air data probes can be included on a particular aircraft, with each air data probe 12a-12n typically including an integrated heater to control icing. As used in the present disclosure, one of any air data probes 12a-12n can be referred to as air data probe 12. The exemplary embodiment shown in FIG. 1 is a commercial fixed-wing aircraft. Air data probe 12 can be used on other vehicles, with non-limiting examples including military aircraft, rotary wing aircraft, unmanned aerial vehicles, spacecraft, and ground vehicles.

FIG. 2A is a schematic diagram of an air data probe heater circuit. Shown in FIG. 2A are aircraft power supply 13, power cable 14, first power lead 16, second power lead 18, and heater 20. Also labeled in FIG. 2A are inlet current $I_{in}$, outlet current $I_{out}$, and length L (i.e., heater length). Aircraft power supply 13 provides electrical power via power cable 14. In an exemplary embodiment, aircraft power supply 13 provides 115 VAC at 400 Hz. In some embodiments, aircraft power supply 13 can provide a voltage and/or frequency that are different from this. In other embodiments, aircraft power supply 13 can provide a direct current (DC) voltage. First power lead 16 and second power lead 18 together provides an electrical connection to heater 20, thereby allowing electrical current to flow through heater 20. Heater 20 can be referred to as an air data probe heater. In a typical embodiment, heater 20 can consume 200-300 Watts in converting electrical power into thermal power. In some embodiments, heater 20 can draw an electrical power level that is different form this. Heater 20 is typically integrated into air data probe 12, and is energized (i.e., powered) to reduce or prevent ice formation on the respective air data probe by raising the surface temperature of the air data probe to a value that can melt and/or control the formation of ice on air data probe 12. Inlet current $I_{in}$ flows into heater 20 through first power lead 16, and outlet current $I_{out}$ flows from heater 20 through second power lead 18, as shown in FIG. 2A. The directions of current flow $I_{in}$, $I_{out}$ are illustrative, using a convention that is used in the electrical art. Under ideal circumstances, $I_{in}$ and $I_{out}$ are approximately equivalent, meaning that there is no other path for current to flow from heater 20. However, heater 20 is prone to failure, as will be described in detail later in FIGS. 3-4. A failure of heater 20 will generally occur at a point along the length L of heater 20, with a failure of heater 20 typically requiring a replacement of the associated air data probe. It is to be appreciated that the illustrated embodiment is greatly simplified, and associated control circuitry, circuit breakers, and the like are not shown. Heater 20 is depicted as a straight element for ease of illustration, but can have other physical configurations in various embodiments. The values provided for power supply voltage and frequency, and heater power consumption, are exemplary and can be different in various embodiments. Power cable 14, first power lead 16, second power lead 18, and heater 20 can be referred to as a heating arrangement.

FIG. 2B is a cross-sectional view of an air data probe heater taken along line 2B-2B of FIG. 2A. Shown in FIG. 2B are heater 20, resistive heating element 22, insulation 24, and sheath 26. In the illustrated embodiment, resistive heating element 22 is made of an oxidation-resistant alloy. Insulation 24 surrounds resistive heating element 22. Insulation 24 is an electrically-insulating material that provides heat conduction outward from resistive heating element 22. Sheath 26 is an oxidation-resistant metallic material that surrounds insulation 24, thereby containing insulation 24 while providing thermal conductivity from heater 20 to the air data probe in which heater 20 is installed. Sheath 26 can be referred to as a metallic sheath. It is to be appreciated that the various materials are selected to provide various desirable properties (e.g., strength, thermal conductivity, oxidation resistance), while also optimizing service life. Notwithstanding, heater 20 is prone to failure over time, as will be described in more detail in FIGS. 3-4.

FIG. 3 is a partial cross-sectional view illustrating heater 20 with compromised insulation 24 taken along line 3-3 of FIG. 2B. FIG. 4 is a partial cross-sectional view illustrating heater 20 with compromised insulation 24 and compromised resistive heating element 24 taken along line 4-4 of FIG. 2B. FIGS. 3-4 illustrate an exemplary mode of failure of heater 20, as will be described, while other failure mechanisms for heater 20 can also occur in various embodiments. Shown in FIGS. 3-4 are heater 20, resistive heating element 22, insulation 24, sheath 26, and heater faults 32, 32A. If sheath 26 is compromised, contaminants can leak through sheath 26 to insulation 24, causing the material of insulation 24 to oxidize, change properties, and/or otherwise break down, thereby causing a path for leakage current $I_L$ to flow from resistive heating element 22 to sheath 26. Non-limiting examples of contaminants include oxygen, moisture, dust, carbon, fuel, oil, deicing fluid, and combustion products. Non-limiting examples of events that can compromise sheath 26 include external damage, latent defects, and fatigue failure (e.g., from vibration). Heater fault 32, shown in FIG. 3, depicts exemplary heater fault 32 that can result from the aforementioned failure mechanism. Leakage current $I_L$ flows through heater fault 32 from resistive heating element 22 to sheath 26, as shown. Over time, heater fault 32 can grow in magnitude, becoming heater fault 32A as shown in FIG. 4. An increase in the value of leakage current $I_L$ typically accompanies the progression of heater fault 32 over the life of heater 20. Moreover, the value of leakage current $I_L$ flowing through heater fault 32 affect the rate of deterioration of heater fault 32, with higher values of leakage current $I_L$ generally resulting in a greater rate of deterioration. Accordingly, if the value of leakage current $I_L$ for a particular heater fault 32 can be reduced, the rate of deterioration can be correspondingly reduced, thereby prolonging the useful life of heater 20. As will be described in more detail later in FIGS. 7-10, reversing the electrical polarity of power supplied to heater 20 can reduce the rate of deterioration of heater fault 32, which can extend the life of heater 20.

Figure 5:
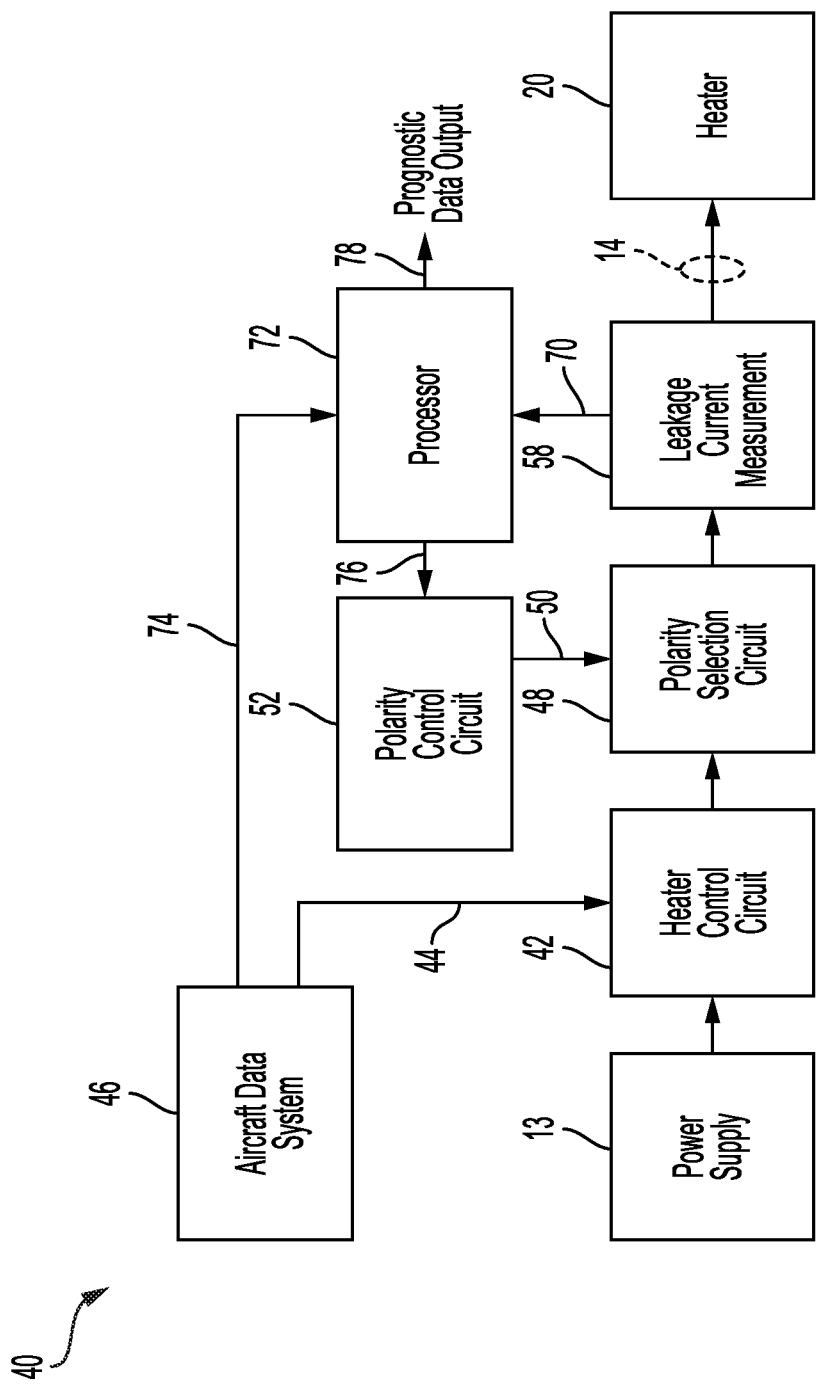
FIG. 5 is a block diagram of a heater monitoring and life extension circuit.

FIG. 5 is a block diagram of a heater monitoring and life extension circuit. Shown in FIG. 5 are aircraft power supply 13, power cable 14, heater 20, control system 40, heater control circuit 42, heater control signal 44, aircraft data system 46, polarity selection circuit 48, polarity selection signal 50, polarity control circuit 52, leakage current measurement system 58, leakage current signal 70, processor 72, flight status signal 74, polarity control signal 76, and prognostic data output 78. The descriptions of aircraft power supply 13, power cable 14, and heater 20 are substantially as provided above in regard to FIGS. 2A-2B. Control system 40 provides monitoring and extension of the life of heater 20, as will be described. Accordingly, control system 40 can also be referred to as a heater monitoring and life extension circuit. Heater control circuit 42 receives heater control signal 44 from aircraft data system 46, thereby controlling the flow of electrical power from power supply 13 to heater 20 to control the accretion of ice on air data probe 12, as described above in regard to FIG. 2A. In an exemplary embodiment, heater control signal 44 can be generated in part based on the air temperature and liquid water content (LWC) that is measured by other systems (not shown) on aircraft 10, and heater control circuit 42 cycles electrical power on and off (i.e., power duty cycle control) to heater 20. Polarity selection circuit 48 controls the polarity of electrical power supplied to heater 20. In the illustrated embodiment, electrical polarity can be either "forward" or "reverse" polarity. The forward polarity can also be referred to as the normal polarity (i.e., as would exist in the absence of polarity selection circuit 48). Polarity selection circuit 48 receives polarity selection signal 50 from polarity control circuit 52, thereby directing either the "forward" or "reverse" electrical polarity of power supplied to heater 20. The forward polarity can be referred to as a first polarity, and the reverse polarity can be referred to as a second polarity. Leakage current measurement system 58 measures the value of leakage current $I_L$ in heater 20 under the particular polarity (i.e., forward or reverse) that is established by polarity selection circuit 48, providing leakage current signal 70 to processor 72. In the illustrated embodiment, leakage current signal 70 is a digital signal that represents the measured value of leakage current $I_L$. Leakage current measurement system 58 will be described in more detail later, in FIG. 6.

Referring again to FIG. 5, aircraft data system 46 provides flight status signal 74 to processor 72, thereby allowing processor 72 to monitor flight conditions of aircraft 10, and accordingly, the operating conditions (i.e., operational parameters) of air data probe 12 and associated heater 20. Processor 72 monitors and records the flight hours (i.e., operational hours) of heater 20 as received via flight status signal 74. Processor 72 controls, monitors, and records the polarity of the electrical power provided to heater 20 associated with the operation of heater 20 (i.e., flight hours). Processor 72 also monitors and records the leakage current $I_L$ that is measured by leakage current measurement system 58 at the particular power supply polarity (i.e., forward or reverse) for each operating period (e.g., flight) of heater 20. Processor 72 generates polarity control signal 76 that is provided to polarity control circuit 52, as described above. Therefore, processor 72 monitors the health of heater 20, while controlling the polarity of electrical power provided to heater 20, thereby extending the life of heater 20 as will be described in more detail in FIGS. 6-10. Processor 72 can be referred to as a prognostic processor. Accordingly, processor 72 provides prognostic data output 78 which can be received by various consumers onboard aircraft 10 and/or external to aircraft 10. The remaining useful life (RUL) of heater 20 can be included in prognostic data output 78. In the illustrated embodiment, processor 72 is a digital processor that receives, processes, and provides digital data.

Figure 6:
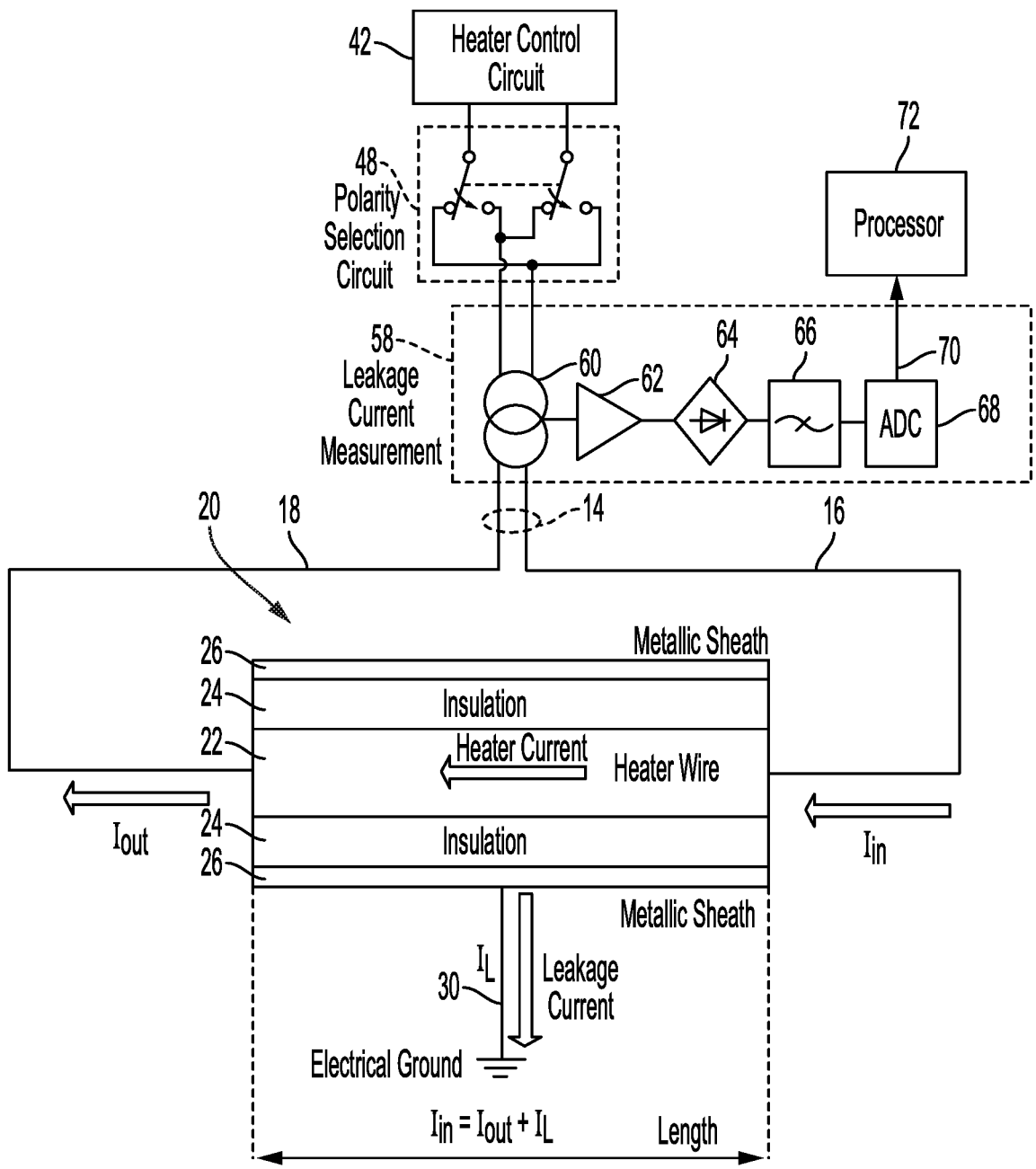
FIG. 6 is a schematic diagram of the air data probe heater and a portion of the heater monitoring and life extension circuit in FIG. 5.

FIG. 6 is a schematic diagram of heater 20 and a portion of control system 40 shown in FIG. 5. Shown in FIG. 6 are power cable 14, first power lead 16, second power lead 18, heater 20, resistive heating element 22, insulation 24, sheath 26, leakage current path 30, heater control circuit 42, polarity selection circuit 48, leakage current measurement system 58, leakage current detector 60, amplifier 62, rectifier 64, filter 66, analog-to-digital converter (ADC) 68, leakage current signal 70, and processor 72. Also labeled in FIG. 5 are inlet current $I_{in}$, outlet current $I_{out}$, leakage current $I_L$, and length L. Power cable 14 is depicted schematically, representing an unspecified length of a two-or-more conductor cable that includes first power lead 16 and second power lead 18. The descriptions of aircraft power supply 13, power cable 14, first power lead 16, second power lead 18, and heater 20, resistive heating element 22, insulation 24, and sheath 26 are substantially as provided above in regard to FIGS. 2A-2B. The descriptions of heater control circuit 42 and polarity selection circuit 48 are substantially as provided above in regard to FIG. 5. In the illustrated embodiment, polarity selection circuit 48 is represented visually as a mechanical polarity-reversing circuit using a double-pole/double-throw (DPDT) electrical switch. In some embodiments, polarity selection circuit 48 can use electronic components (e.g., semiconductor devices) to reverse the electrical polarity. When heater 20 is operating normally, inlet current $I_{in}$ flows into resistive heating element 22 (i.e., heater 20) through first power lead 16, and outlet current $I_{out}$ flows from resistive heating element 22 through second power lead 18, with $I_{in}$ being approximately equal to $I_{out}$ as described above in regard to FIG. 2A. A typical value of heater current flow (i.e., $I_{in}$, $I_{out}$) can range from about 1-3 amps (A), however these values can be different in other embodiments. A small amount of leakage current $I_L$ flows through leakage current path 30, schematically represented as flowing from sheath 26 to ground (i.e., chassis ground). The relationship between inlet current $I_{in}$, outlet current $I_{out}$, and leakage current $I_L$ can be calculated using equation 1 as follows:

$$I_{in}=I_{out}+I_L \qquad \text{Equation 1:}$$

It is to be appreciated that a properly functioning heater 20 will experience a nominal value of leakage current $I_L$ by virtue of the nature of insulation 24. When a newly-manufactured heater 20 (i.e., associated air data probe 12) is installed, the baseline value of leakage current $I_L$ is typically measured and recorded for each power supply polarity (i.e., forward and reverse). These values can be referred to as the baseline leakage current $I_{L\text{-}baseline}$, or as the leakage current $I_L$ at inception. A typical value of baseline leakage current $I_{L\text{-}baseline}$ can range from about 10-50 microamps (μA), but this value can vary over a wide range depending on the particular embodiment of heater 20. For example, in some embodiments, baseline leakage current $I_{L\text{-}baseline}$ can range up to about 2 milliamps (mA), or higher. In other embodiments, baseline leakage current $I_{L\text{-}baseline}$ can be less than 10 μA. As heater 20 operates, it is normal for leakage current $I_L$ to gradually increase as a result of minor degradation of insulation 24. The normal migration of environmental impurities (e.g., contaminants as discussed above in regard to FIGS. 3-4) into insulation 24 is an example of a typical degradation of insulation 24 over the lifetime of a particular heater 20. Because heater 20 is typically powered when an aircraft is flying, an expected heater lifetime can be expressed as a measure of flight hours. Several factors (e.g., physical size of heater 20, power consumption of heater 20, physical location of heater 20) can affect the expected lifetime of heater 20 in a particular embodiment, with typical values ranging from about 13K-100K flight hours. In some embodiments, the expected lifetime of heater 20 can exceed 100K hours, because an object of the present disclosure is directed to a method of extending the lifetime of heater 20. Moreover, the expected lifetime of heater 20 can shift higher within the typical range of 13K-100K flight hours (i.e., the mean time between failures (MTBF) can become a larger number of hours).

Heater end-of-life (EOL) is typically associated with a particular threshold value $I_{L\text{-}threshold}$, which can vary depending on the particular embodiment of heater 20. Exemplary values of threshold value $I_{L\text{-}threshold}$ can range from about 2-50 mA, but this can vary in different embodiments. Accordingly, the remaining useful life (RUL) can be estimated from a measured value of leakage current $I_L$. An object of the present disclosure is to provide a system and method of measuring the value of leakage current $I_L$ throughout the service life of heater 20 for each of the forward and reverse polarities of power supplied to heater 20, thereby providing an indication of RUL while also identifying an abnormal condition that could be indicative of a premature failure of heater 20. It is desirable to replace an air data probe (i.e., and associated heater 20) prior to the EOL or prior to the point of failure, to avoid an operational delay and interruption (ODI) that could result following a failure. On the other hand, because replacing air data probe 12 (i.e., and associated heater 20) can be expensive in terms of time and cost, while also removing associated aircraft 10 from operation, it is desirable to extract a maximum useful service life from heater 20 prior to the point of replacement. As will be described later in FIGS. 7-8, power supply polarity switching can extend the life of heater 20.

Referring again to FIG. 6, and Equation 1, the value of leakage current $I_L$ can be expressed in equation 2 as being the difference between inlet current $I_{in}$ and outlet current $I_{out}$:

$$I_L=I_{in}-I_{out} \qquad \text{Equation 2:}$$

In the illustrated embodiment, leakage current measurement system 58 includes leakage current detector 60, amplifier 62, rectifier 64, filter 66, and ADC 68. Leakage current detector 60 senses leakage current $I_L$ by sensing the difference between inlet current $I_{in}$ and outlet current $I_{out}$. In an exemplary embodiment, leakage current detector 60 is a differential inductive device that produces an output AC waveform representative of the value of leakage current $I_L$. During operation, the output of leakage current detector 60 is amplified by amplifier 62, rectified by rectifier 64 to produce a direct current (DC) signal, filtered by filter 66, and then digitized by ADC 68, thereby producing leakage current signal 70 that is a digitized representation of the value of leakage current $I_L$. Leakage current signal 70 is provided to processor 72 (i.e., prognostic processor), as described above in regard to FIG. 5. In other embodiments, leakage current detector 60 can include resistive devices that produce voltage signals representative of the values of inlet and outlet current $I_{in}$, $I_{out}$, respectively, that are input to a difference amplifier. In yet other embodiments, other detectors can be used to sense the value of leakage current $I_L$. In some of these embodiments, leakage current detector 60 can measure leakage current $I_L$ resulting from an AC and/or DC voltage that is supplied to heater 20. In any of these embodiments, leakage current measurement system 58 can omit any one or more of the various constituent elements shown in FIG. 6. Leakage current $I_L$ can be referred to as heating leakage current (i.e., corresponding to leakage current $I_L$ of the heating arrangement).

Processor 72 is a digital processor that receives, stores, scales, and processes leakage current signal 70 (i.e., the digitized value of leakage current $I_L$) that is received throughout the lifecycle of heater 20, while associating leakage current signal 70 with the polarity of electrical power supplied to heater 20, flight hours, and so on. Therefore, processor 72 includes internal and/or connected memory and/or storage devices. Processor 72 can receive and process the digitized leakage current value continuously or periodically. In the illustrated embodiment, processor 72 can include one or more processors (not shown in FIGS. 5-6) that are configured to implement functionality and/or process instructions for execution within processor 72. The one or more processors can be capable of processing instructions stored in one or more storage device(s) (not shown in FIGS. 5-6). Examples of processors can include any one or more of a microprocessor, a microcontroller, a digital signal processor (DSP), an application specific integrated circuit (ASIC), a field-programmable gate array (FPGA), or other equivalent discrete or integrated logic circuitry. In some embodiments, processor 72 can receive multiple inputs corresponding to multiple leakage current signals 70 from multiple associated heaters 20. In other embodiments, processor 72 can receive data from other aircraft data sources and/or perform other functions in addition to those described here. In any of these embodiments, processor 72 can be a neural network. In some embodiments, processor 72 can provide information regarding one or more heaters 20 with regard to the present and/or most recent values of leakage current $I_L$ for the forward and reverse polarities, the history of leakage current $I_L$ over time for each polarity (e.g., operating time, calendar time), the service life of heater 20 (e.g., operating time), the expected EOL, the calculated RUL, and status as to whether heater 20 is restricted in operation to a particular polarity. Collectively, these various data can be referred to as prognostic data. The aforementioned data can be provided to other systems (e.g., avionics system) for use by crew members. In these or other embodiments, prognostic data output 78 (i.e., prognostic data) can be transmitted and/or downloaded to engineering teams at an airline's operator, maintenance facility, and/or the various component suppliers whereby the data can be reviewed, analyzed, and/or archived. When installed on a system that includes one or more heaters 20, control system 40 can track the health of each of multiple heaters 20 aboard aircraft 10, allowing maintenance personnel to predict when failure of heaters 20 are likely to occur so that maintenance can be scheduled prior to the point of expected failure for any particular heater 20. This can avoid flight delays that could ground an aircraft for emergent maintenance requirements, and it can also help prevent the in-flight failure of a particular heater 20 that could be disruptive to the performance of an associated air data probe 12.

Figure 7:
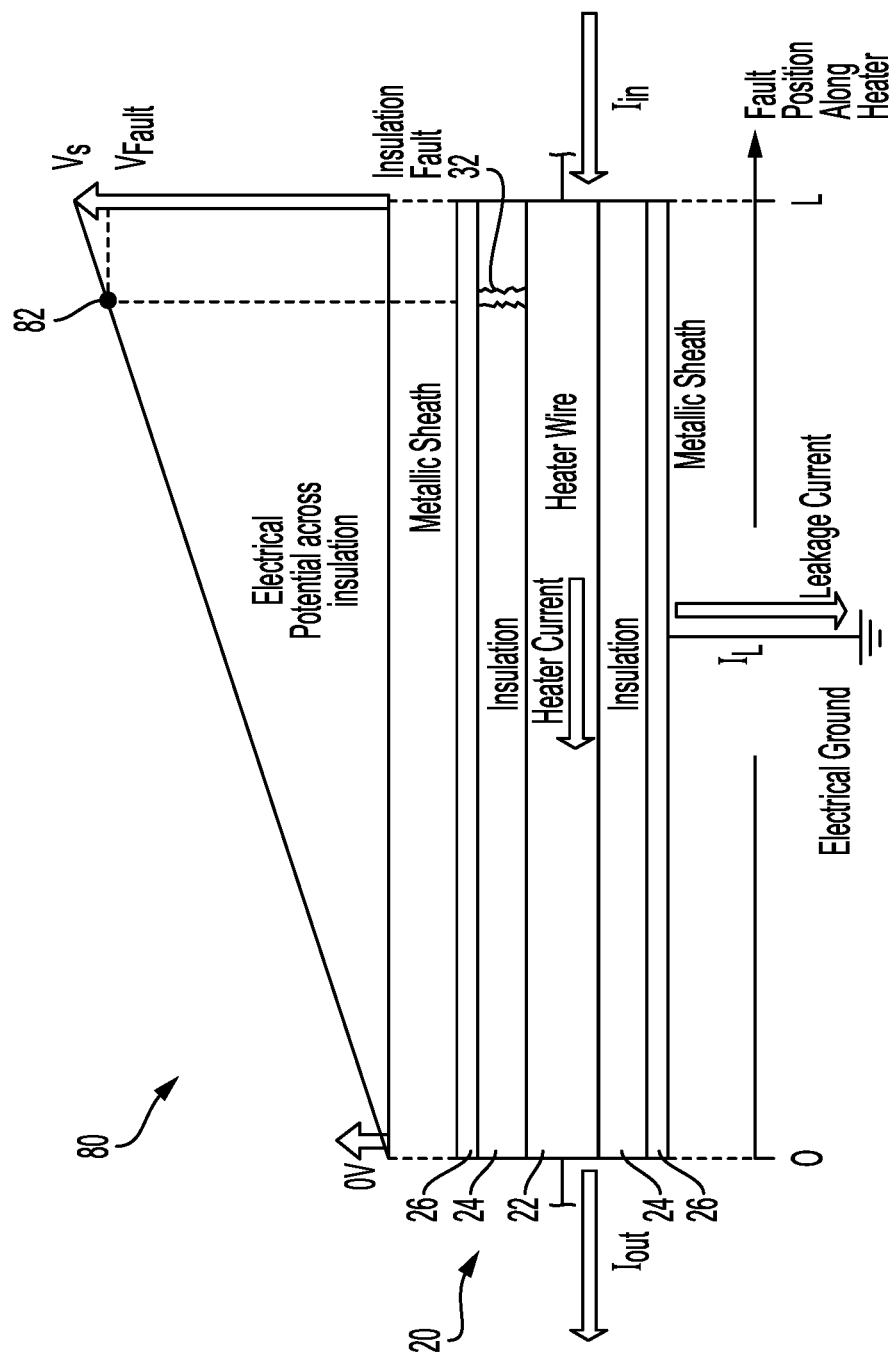
FIG. 7 is a graph of electrical potential across the heater insulation shown in FIG. 6 for a forward voltage polarity.

FIG. 7 is a graph of electrical potential across insulation 24 shown in FIG. 6 for a forward voltage polarity (i.e., first polarity). Shown in FIG. 7 are heater 20 and forward polarity voltage graph 80. Heater 20 includes resistive heating element 22, insulation 24, sheath 26, and heater fault 32, all having a description as provided above in regard to FIG. 6. Inlet current $I_{in}$, outlet current $I_{out}$, leakage current $I_L$, and length L are labeled on heater 20 in a manner similar to that shown in FIG. 6. Forward polarity voltage graph 80 is scaled to overlie heater 20, with the horizontal axis depicting heater fault 32 position along length L of heater 20. Therefore, the horizontal axis of forward polarity voltage graph 80 is scaled from zero to length L. In the illustrated embodiment, heater supply voltage $V_S$ is supplied to the end of heater 20 corresponding to where inlet current $I_{in}$ enters heater 20. The opposite end of heater 20 (i.e., corresponding to where outlet current $I_{out}$ exits heater 20) is at ground potential (i.e., 0 volts). Forward polarity voltage graph 80 depicts the voltage potential across insulation 22 (i.e., voltage potential between resistive heating element 22 and sheath 26) at any point along heater 20. In the illustrated embodiment, resistive heating element 22 has a uniform electrical resistance per unit length, thereby resulting in a linear decrease in voltage potential along heater 20 from heater supply voltage $V_S$ to zero. Accordingly, insulation fault point 82 has a fault voltage potential $V_{Fault}$ that exists across heater fault 32. In the illustrated embodiment, heater fault 32 (i.e., insulation fault) is at a position that is about one-tenth of the length into heater 20 from where heater supply voltage $V_S$ is applied. Therefore, fault voltage potential $V_{Fault}$ will be about 90% of heater supply voltage $V_S$. In an exemplary embodiment where heater supply voltage $V_S$ is 115 volts, fault voltage potential $V_{Fault}$ is about 103.5 volts (i.e., 90% of 115 volts). With heater fault 32 having a particular fault electrical resistance $R_{Fault}$ value measured from resistive heating element 22 to sheath 26, the leakage current flow through fault 32 (i.e., leakage current $I_L$) can be calculated by Ohm's Law:

$$I_L = \frac{V_{Fault}}{R_{Fault}} \qquad \text{Equation 3}$$

Accordingly, in this exemplary embodiment, leakage current $I_L$ will be driven across heater fault 32 by a fault voltage potential $V_{Fault}$ of about 103.5 volts. The significance of this will be discussed in greater detail later, in FIGS. 8-9.

Figure 8:
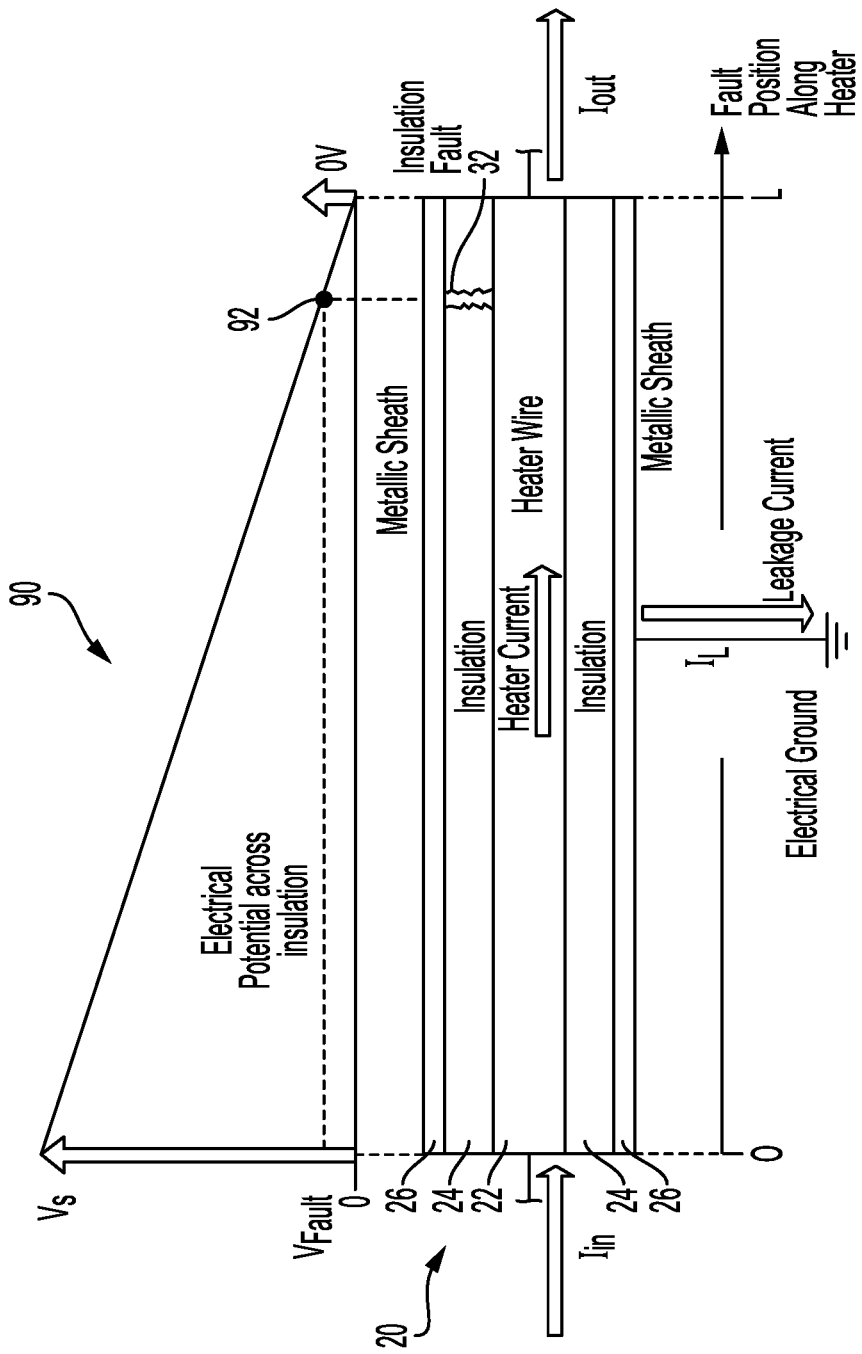
FIG. 8 is a graph of electrical potential across the heater insulation shown in FIG. 6 for a reverse voltage polarity.

FIG. 8 is a graph of electrical potential across insulation 24 shown in FIG. 6 for a reverse voltage polarity (i.e., second polarity). Shown in FIG. 8 are heater 20 and reverse polarity voltage graph 90, with reverse polarity voltage graph 90 showing insulation fault point 92. Heater 20, including resistive heating element 22, insulation 24, sheath 26, and heater fault 32, each have a description that is substantially similar to that provided above in regard to FIGS. 6-7. Inlet current $I_{in}$, outlet current $I_{out}$, leakage current $I_L$, length L, heater supply voltage $V_S$, and fault voltage potential $V_{Fault}$ are labeled on FIG. 8, each having a description that is substantially similar to those provided above in regard to FIG. 7. In the illustrated embodiment, the polarity of heater supply voltage $V_S$ has been reversed from the embodiment shown in FIG. 7, being supplied to the opposite end of heater 20. Reverse polarity voltage graph 90 depicts the voltage potential across insulation 22 (i.e., voltage potential between resistive heating element 22 and sheath 26) at any point along heater 20 as a result of the reverse polarity being supplied to heater 20. In the illustrated embodiment, heater fault 32 (i.e., insulation fault) is at a position that is about nine-tenths of the length into heater 20 from where heater supply voltage $V_S$ is applied, because of the aforementioned voltage polarity reversal. Therefore, fault voltage potential $V_{Fault}$ is about 10% of heater supply voltage $V_S$. In an exemplary embodiment described above in regard to FIG. 7 (i.e., heater supply voltage $V_S$ is 115 volts), fault voltage potential $V_{Fault}$ is about 11.5 volts (i.e., 10% of 115 volts). With heater fault 32 having a particular fault electrical resistance $R_{Fault}$ value measured from resistive heating element 22 to sheath 26, the leakage current flow through heater fault 32 (i.e., leakage current $I_L$) has a correspondingly lower value, as can be shown by equation 3.

As can be appreciated from the description provided above in regard to FIGS. 7-8, the polarity of heater supply voltage $V_S$ can have an effect of the value of leakage current $I_L$ depending on the location of heater fault 32. Because with higher values of leakage current $I_L$ can generally result in a greater rate of deterioration of heater fault 32, it can be advantageous to evaluate whether a forward or reverse polarity of heater supply voltage $V_S$ results in a lower value of leakage current $I_L$, and to preferentially operate control system 40 in a mode that reduces the value of leakage current $I_L$, thereby prolonging the service life of heater 20. Knowing the values of both forward polarity leakage current $I_F$ (i.e., forward leakage current $I_F$) and reverse polarity leakage current $I_R$ (i.e., reverse leakage current $I_R$) will provide a better understanding of the severity of heater fault 32. In some embodiments, this can reduce or eliminate the dependence on the RUL estimate that is obtained from a single-polarity heater leakage current $I_L$ measurement and associated prognostic calculations. In some embodiments, knowing the values of both forward and reverse leakage currents $I_F$, $I_R$ can give an indication of the inception of a heater insulation failure that is otherwise undetectable by a single-polarity heater leakage current $I_L$ measurement. Moreover, by comparing the values of forward polarity leakage current $I_F$ and reverse polarity leakage current $I_R$, an indication can be made of the position of heater fault 32 in heater 20 (i.e., in air data probe 12). Knowing the location of heater fault 32 can be helpful in performing failure analysis (FA), Failure Mode and Effects Analysis (FMEA), design improvements, and so on.

Figure 9:
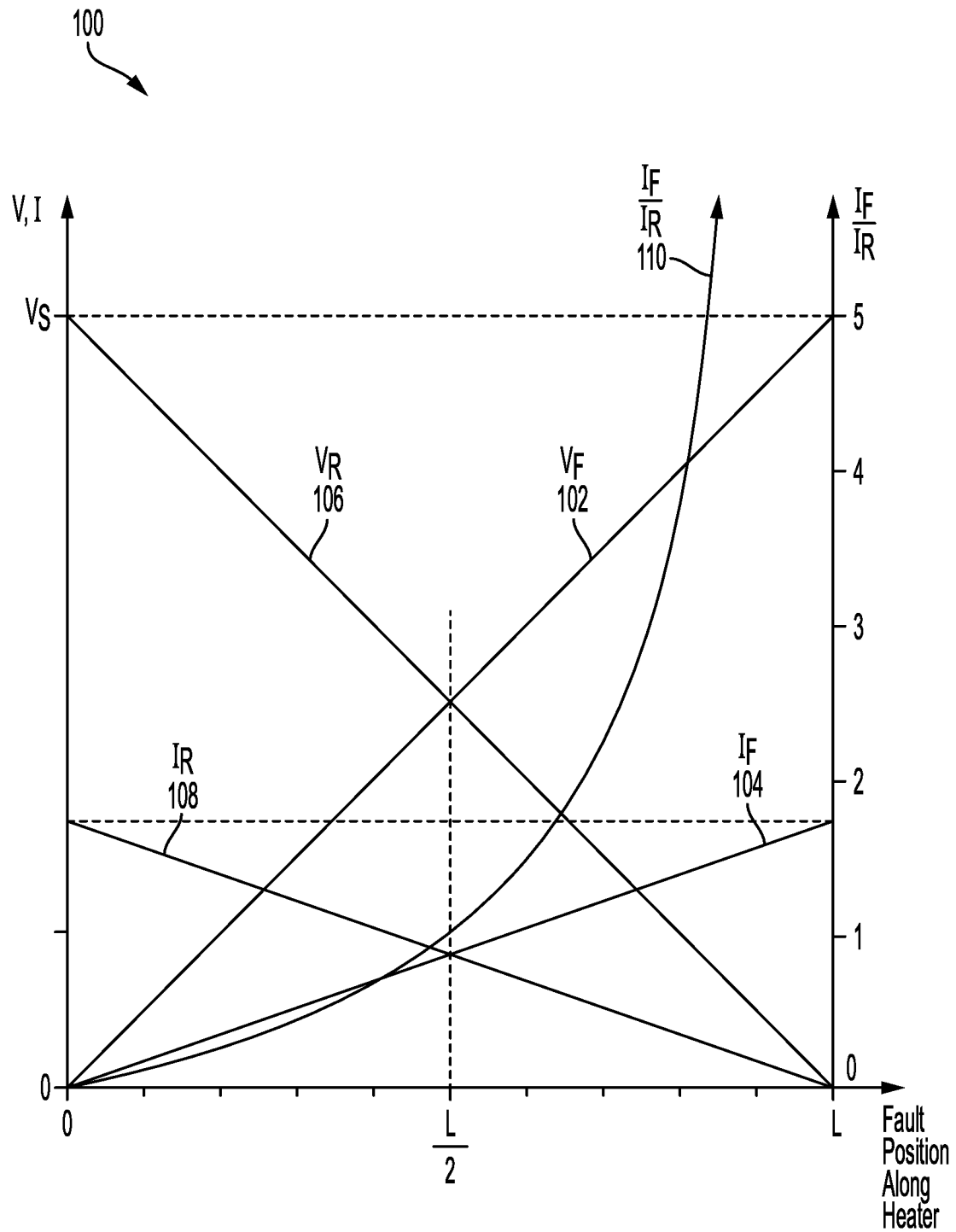
FIG. 9 is a graph of electrical potentials across the heater insulation, leakage currents, and a ratio of forward polarity leakage current to reverse polarity leakage current for the heater insulation shown in FIG. 6.

FIG. 9 is a graph of electrical potentials across the heater insulation, leakage currents, and a ratio of forward polarity leakage current to reverse polarity leakage current for the heater insulation shown in FIG. 6. Shown in FIG. 9 are graphs 100, forward voltage graph 102, forward current graph 104, reverse voltage graph 106, reverse current graph 108, and current ratio graph 110. Forward voltage graph 102 depicts the voltage potential (i.e., forward voltage $V_F$) across insulation 22 along length L of heater 20, linearly ranging from zero to heater supply voltage $V_S$, as described above in regard to FIG. 7. Forward current graph 104 depicts leakage current $I_L$ for a particular heater fault 32 having a particular fault electrical resistance $R_{Fault}$ value at any point along length L of heater 20. It is to be appreciated that forward voltage and current graphs 102, 104 are conceptual, and that specific values of voltage, current, and resistance are not provided. Reverse voltage graph 106 depicts the voltage potential (i.e., reverse voltage $V_R$) across insulation 22 along length L of heater 20, linearly ranging from zero to heater supply voltage $V_S$ in a direction that is the reverse of that provided for forward voltage graph 102. Similarly, reverse current graph 108 follows reverse voltage graph 106, while having a description similar to that provided for forward current graph 104.

Current ratio graph 110 graphically depicts the quotient of forward current graph 104 to reverse current graph 104, with equation 4 being used to expresses the current ratio in terms of forward leakage current $I_F$ and reverse leakage current $I_R$ for a particular heater fault 32 at any position along length L of heater 20:

$$\text{Current Ratio} = \frac{I_F}{I_R} \qquad \text{Equation 4}$$

It is noteworthy that current ratio has a value of 1.0 where forward current $I_F$ and reverse current $I_R$ are equal, occurring at a fault position that is midpoint along heater 20 (i.e., corresponding to L/2 as shown in FIG. 9). Accordingly, a comparison of the values of forward current $I_F$ and reverse current $I_R$ for a particular heater fault 32 can be made to identify the position of heater fault 32 (i.e., fault position). In an exemplary embodiment, processor 72 (shown in FIGS. 5-6) can calculate the current ratio $I_F/I_R$ and/or the inverse current ratio (i.e., $I_R/I_F$) to identify the fault position. In some embodiments, processor 72 can use one or more of $I_F$, $I_R$, $(I_F+I_R)$, and $(I_F-I_R)$ to identify the fault position. In other embodiments, processor 72 can use one or more of the aforementioned parameters, and/or any other parameters, to identify the fault position. A current differential ratio can also be defined using measured values of $I_F$ and $I_R$ as follows:

$$\text{Current Differential Ratio} = \frac{I_F - I_R}{I_F + I_R} \qquad \text{Equation 5}$$

It is to be appreciated that a graph of current differential ratio for nominal values of $I_F$ and $I_R$ could also be shown along length L of heater 20 (i.e., as in FIG. 9), with current differential ratio having a benefit of indicating the location of heater fault 32 in a normalized linear fashion relative to length L of heater 20.

Figure 10:
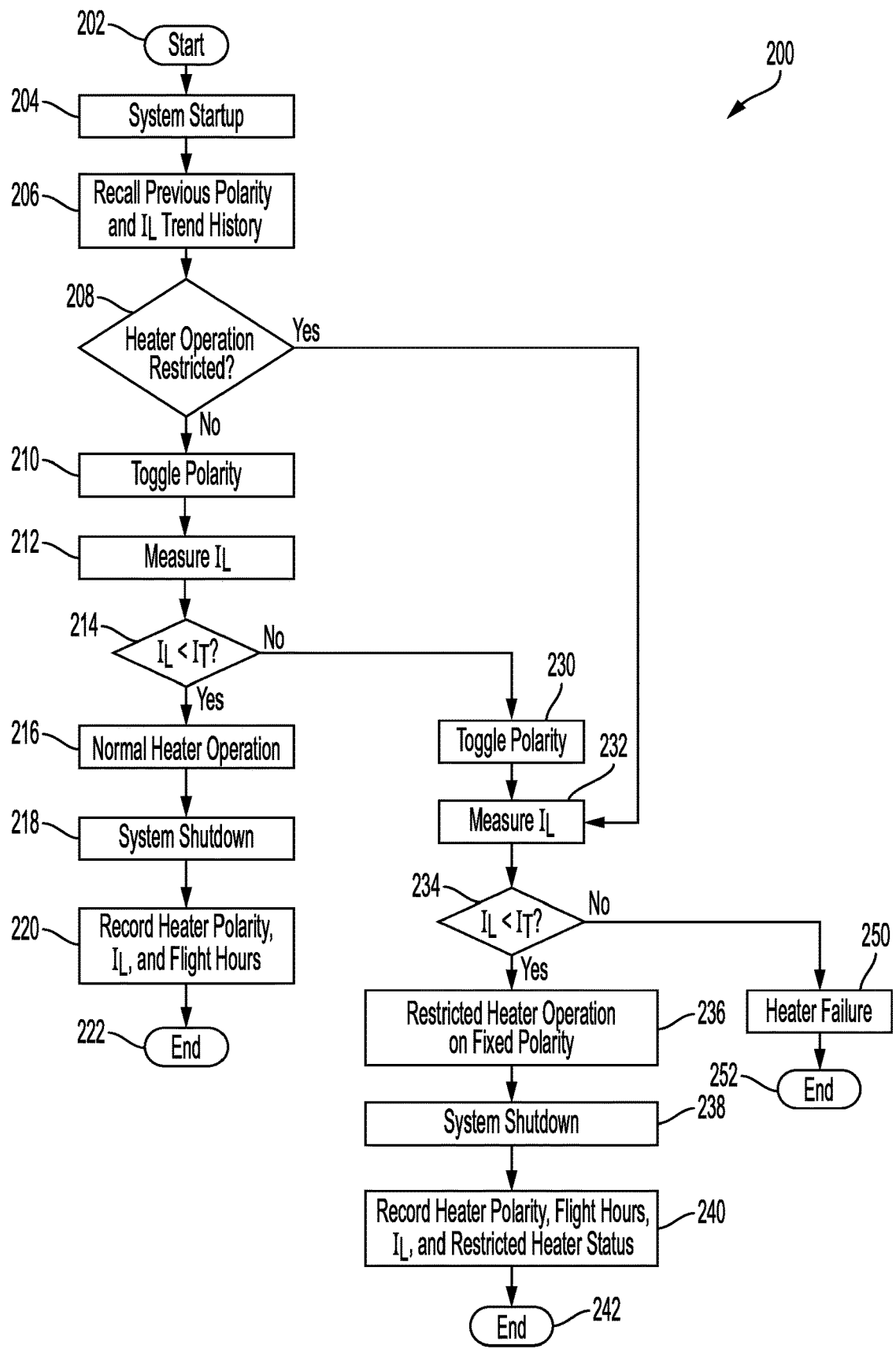
FIG. 10 is a process flow chart for the heater monitoring and life extension circuit shown in FIG. 5.

FIG. 10 is a process flow chart for the heater monitoring and life extension circuit shown in FIG. 5. Shown in FIG. 10 are heater monitoring and life extension flow chart 200, starting step 202, system startup step 204, recall previous polarity step 206, restricted heater operation decision 208, toggle polarity step 210, measure $I_L$ step 212, make $I_L<I_T$ decision 214, normal heater operation step 216, system shutdown step 218, record heater polarity, $I_L$, and flight hours step 220, end step 222, toggle polarity step 230, measure IL step 232, make $I_L<I_C$ decision 234, restricted heater operation on fixed polarity step 236, system shutdown step 238, record heater polarity, flight hours, $I_L$, and restricted heater status step 240, end step 242, heater failure step 250, and end step 252. Heater monitoring and life extension flow chart 200 depicts an exemplary embodiment of using control system 40 for monitoring and extending the lifetime of heater 20, with many other embodiments being able to achieve the same object of the present disclosure. Heater monitoring and life extension flow chart 200 presumes that a properly-functioning heater 20 is installed for use, and that heater 20 had previously operated properly. It is to be appreciated that modifications can be made to heater monitoring and life extension flow chart 200, if necessary, to accommodate extraordinary circumstances (e.g., a newly-installed heater 20 with previous usage hours, or a repaired heater 20).

Beginning with starting step 202, system startup step 204 occurs when aircraft 10 prepares for flight operations after which electrical power will be applied to heater 20 to control ice accumulation of air data probe 12. In the illustrated embodiment, a particular polarity (i.e., forward or reverse) is provided to heater 20 during the flight of aircraft 10, which can be taken to be the period from take-off to landing.

Control system 40 recalls the stored polarity that had been used during the previous flight in recall previous polarity step 206, and whether heater operation had been restricted to a preferred polarity (e.g., either forward or reverse) in restricted heater operation decision 208. If heater operation is not restricted, control system 40 toggles the polarity from the previous polarity in toggle polarity step 210. In an exemplary embodiment, toggling the polarity for each flight can help in balancing the operating hours heater 20 experiences between forward and reverse polarities, thereby balancing insulation 24 loading in the early phase of heater 20 lifetime, which can help extend the lifetime of heater 20. For example, if the recalled previous polarity is "forward", then control system toggles the polarity for the present operation to "reverse", and vice versa. Early in the service life of heater 20, leakage current $I_L$ has a value that is approximately that of baseline leakage current $I_{L\text{-}baseline}$, and it can be preferable to alternate the polarity for every flight. Accordingly, unless heater operation has become restricted to a particular polarity, toggle polarity step 210 accomplishes the objective of alternating the polarity for each flight. Next, measure $I_L$ step 212 measures the value of leakage current $I_L$ for the selected polarity, so that a determination can be made as to whether leakage current $I_L$ is at or above a particular leakage current threshold value $I_{L\text{-}threshold}$ (i.e., $I_T$) for the particular polarity. As described above in regard to FIG. 6, achieving leakage current threshold value $I_{L\text{-}threshold}$ can be an end-of-life indication for heater 20, and under some conditions, it is desirable to nor operate heater 20 at a value of leakage current $I_L$ at or above leakage current threshold value $I_{L\text{-}threshold}$. Accordingly, in make $I_L < I_T$ decision 214, if the value of leakage current $I_L$ is less than the threshold value $I_T$, normal heater operation can occur for the flight in normal heater operation step 216. At the end of the flight, after aircraft 10 has landed and ice control on air data probe 12 is no longer required, the electrical power to heater 20 is removed in system shutdown step 218. Next, the heater polarity that had been used on the just-ended flight, the measured value of leakage current $I_L$ for the particular polarity that was used, and the operating hours (i.e., flight hours) is recorded by control system 40 in record heater polarity, $I_L$, and flight hours step 220, followed by end step 222. By recording the operating time (i.e., operating hours) after each flight, control system 40 can provide accurate information at prognostic data output 78, as described above in regard to FIG. 5. In some embodiments, it may be desirable to balance the operating hours of heater 20 on each of the forward and reverse polarities. For example, aircraft 10 may experience alternating flights of different duration, which over time can evolve into an imbalance in the number of flight hours for one polarity as opposed to the other. In a particular embodiment, control system 40 can remedy the aforementioned imbalance by temporarily restricting heater operation to the polarity having the fewer number of operating hours. In this particular embodiment, control system 40 can cancel the restricted heater operation condition after the flight hours have been balanced. As used in the present disclosure, flight hours can be said to be balanced when the number of flight hours for each of the forward and reverse polarities are within 200 hours of each other.

Referring again to FIG. 10, if the value of leakage current $I_L$ is at or above the leakage current threshold value $I_{L\text{-}threshold}$ for a particular polarity in make $I_L < I_T$ decision 214, then control system 40 determines that polarity should not be used, thereby invoking toggle polarity step 230 to select the opposite polarity. Next, leakage current $I_L$ is measured in measure $I_L$ step 232, followed by make $I_L < I_T$ decision 234 where the measured value of leakage current $I_L$ is compared against the leakage current threshold value $I_{L\text{-}threshold}$. If the measured value of leakage current $I_L$ is less than the leakage current threshold value $I_{L\text{-}threshold}$, then control system 40 determines that heater 20 is usable only under the selected polarity, which is then permanently set for heater 20 in restricted heater operation on fixed polarity step 236. In particular embodiments where heater fault 32 is located near one end or the other of heater 20 (e.g., as in the exemplary embodiments shown in FIGS. 7-8), the operational life of heater 20 can be significantly extended using restricted heater operation on fixed polarity step 236 as compared to removing heater 20 from service as soon as the value of leakage current $I_L$ achieves the leakage current threshold value $I_{L\text{-}threshold}$ under the previous polarity. The descriptions of system shutdown step 238, record heater polarity, flight hours, $I_L$, and restricted heater status step 240, end step 242 are substantially similar to those provided above, while noting that the permanently-restricted heater operation condition is recorded for the duration of the service life of heater 20. Referring again to make $I_L < I_T$ decision 234, if the measured value of leakage current $I_L$ is at or above the leakage current threshold value $I_{L\text{-}threshold}$, then control system 40 determines that heater 20 is unusable under either polarity, thereby invoking heater failure step 250 and end step 252. The foregoing description presumes that measuring a value of leakage current $I_L$ that is at or above the leakage current threshold value $I_{L\text{-}threshold}$ is an end-of-life criterion for a particular polarity. In some embodiments, two or more threshold values can be established for leakage current $I_L$. In these or other embodiments, it can be deemed acceptable to operate heater 20 with leakage current $I_L$ at or above the leakage current threshold value $I_{L\text{-}threshold}$ under certain conditions, for a certain period of time, and so on.

The exemplary embodiment of control system 40 shown and described in FIG. 10 is one of many possible algorithms that control system 40 can be used to measure and extend the life of heater 20 through power supply polarity switching. Heater monitoring and life extension flow chart 200 included exemplary recording steps where control system 40 recorded values. It is to be appreciated that control system 40 can record and/or transmit various values and/or other parameters at times and/or under conditions other than those shown in FIG. 10. Moreover, leakage current $I_L$ can be measured at times and/or under conditions other than those shown in FIG. 10. In some embodiments, leakage current $I_L$ can be measured periodically and/or continuously during flight, and/or prior to system shutdown steps 218, 238 at the end of a flight. Moreover, as described above in regard to FIG. 9, control system 40 (i.e., processor 72) can perform calculations based on measured and/or stored values of leakage current $I_L$ at each polarity. Accordingly, in some embodiments, heater monitoring and life extension flow chart 200 can include additional measurements and/or data (e.g., prognostic data output 78) in various decision steps and/or in setting and/or removing a restricted heater operation condition.

The exemplary embodiments shown and described in the present disclosure pertain to heaters on aircraft air data probes. The scope of the present disclosure includes all electrical heaters that can be receive electrical power via two electrical leads (i.e., inlet current $I_{in}$ and outlet current $I_{out}$), without regard to power type (i.e., AC or DC), voltage, frequency, current, power, or location. Accordingly, control system 40 can be used on one or more heaters 20 that are located or installed in any vehicle, building, or other location. Non-limiting examples of types of heaters that are within the scope of the present disclosure include wing ice protection heaters, water heaters, tank heaters, process heaters, stoves, ovens, and floor heaters that can be installed on aircraft, non-aircraft vehicles, buildings (e.g., residential, commercial, industrial, military), factories, and so on.

Discussion of Possible Embodiments

The following are non-exclusive descriptions of possible embodiments of the present invention.

A method of monitoring a heating arrangement, the method comprising: applying a first polarity voltage to a heater of the heating arrangement; detecting a first polarity heating leakage current; applying a second polarity voltage to the heating arrangement; detecting a second polarity heating leakage current; and determining health of the heating arrangement via the first polarity heating leakage current and the second polarity heating leakage current.

The method of the preceding paragraph can optionally include, additionally and/or alternatively, any one or more of the following features, configurations and/or additional components:

A further embodiment of the foregoing method, further comprising: generating, via a polarity control circuit, a heater voltage polarity signal based on the first polarity heating leakage current and the second polarity heating leakage current; and applying to the heater, via a polarity selection circuit and based on the heater voltage polarity signal, either the first polarity heater voltage or the second polarity heater voltage, thereby increasing useful life of the heating arrangement.

A further embodiment of the foregoing method, further comprising: measuring, via a leakage measurement circuit, the first polarity heating leakage current or the second polarity heating leakage current; storing, via a processor, the first polarity heating leakage current or the second polarity heating leakage current; retrieving, via the processor, a last measured value of the first polarity heating leakage current; retrieving, via the processor, a last measured value of the second polarity heating leakage current; and comparing, via the processor, the last measured value of the first polarity heating leakage current with the last measured value of the second polarity heating leakage current to determine the heater voltage polarity signal that minimizes the heating leakage current.

A further embodiment of the foregoing method, wherein: the heater of the heating arrangement comprises: a resistive heating element; electrical insulation surrounding the resistive heating element; and a metallic sheath surrounding the electrical insulation; an inlet current flows into the resistive heating element; an outlet current flows out of the resistive heating element; the heating leakage current flows from the resistive heating element to the metallic sheath; and the inlet current is equal to the sum of the outlet current and the heating leakage current.

A further embodiment of the foregoing method, further comprising determining, via the leakage current measurement circuit, the heating leakage current by measuring a difference between the inlet current and the outlet current.

A further embodiment of the foregoing method, further comprising: calculating, via a processor, the first polarity heating leakage current; calculating, via the processor, the second polarity heating leakage current; calculating, via the processor, a remaining first polarity useful life of the heating arrangement using the first polarity heating leakage current; and calculating, via the processor, a remaining second polarity useful life of the heating arrangement using the second polarity heating leakage current.

A further embodiment of the foregoing method, wherein generating the heater voltage polarity signal comprises: setting the polarity command signal to the first polarity if the second polarity heating leakage current exceeds a threshold value of heating leakage current; and setting the polarity command signal to the second polarity if the first polarity heating leakage current exceeds the threshold value of heating leakage current.

A further embodiment of the foregoing method, further comprising balancing, via the processor, a heating arrangement operational time using the first polarity heater voltage with the heating arrangement operational time using the second polarity heater voltage, thereby extending the useful life of the heating arrangement.

A further embodiment of the foregoing method, further comprising providing, via the processor, one or more heater health notifications, each of the one or more heater health notifications selected from the list consisting of: first polarity heating leakage current, second polarity heating leakage current, first polarity heating arrangement operational hours, second polarity heating arrangement operational hours, total heating arrangement operational hours, remaining first polarity useful heating arrangement life, remaining second polarity useful heating arrangement life, and remaining total useful heating arrangement life.

A heating arrangement monitoring system comprising: a leakage current measurement circuit configured to measure a heating leakage current, wherein the heating leakage current is either: a first polarity heating leakage current as a result of applying a first polarity voltage to the heating arrangement; or a second polarity heating leakage current as a result of applying a second polarity voltage to the heating arrangement; and a processor, configured to determine a health of the heating arrangement based on one or more measured values of the first polarity heating leakage current and the second polarity heating leakage current.

The system of the preceding paragraph can optionally include, additionally and/or alternatively, any one or more of the following features, configurations and/or additional components:

A further embodiment of the foregoing system, further comprising: a polarity selection circuit configured to apply a heater voltage to the heating arrangement using either a first polarity or a second polarity; and a polarity control circuit configured to receive a polarity command signal and to direct the polarity selection circuit to apply a selected heater voltage polarity that is either the first polarity or the second polarity; wherein the processor is configured to: calculate the first polarity heating leakage current; calculate the second polarity heating leakage current; and generate the polarity command signal based on the calculated values of the first polarity heating leakage current and the second polarity heating leakage current.

A further embodiment of the foregoing system, wherein the processor is further configured to optimize a useful life of the heating arrangement by generating the polarity command signal based on the first polarity heating leakage current and the second polarity heating leakage current by: setting the polarity command signal to the first polarity if the second polarity heating leakage current exceeds a threshold value of heating leakage current; and setting the polarity command signal to the second polarity if the first polarity heating leakage current exceeds the threshold value of heating leakage current.

A further embodiment of the foregoing system, wherein: the heating arrangement includes a heater, comprising: a resistive heating element; electrical insulation surrounding the resistive heating element; and a metallic sheath surrounding the electrical insulation; an inlet current flows into the resistive heating element; an outlet current flows out of the resistive heating element; the heating leakage current flows from the resistive heating element to the metallic sheath; and the heating leakage current is a difference between the inlet current and the outlet current.

A further embodiment of the foregoing system, wherein the processor is configured to predict a failure of the heating arrangement based on the measured first polarity heating leakage current, or the measured second polarity heating leakage current, or both.

A further embodiment of the foregoing system, wherein the processor is configured to: calculate a remaining first polarity useful life of the heating arrangement using the first polarity heating leakage current; and calculate a remaining second polarity useful life of the heating arrangement using the second polarity heating leakage current.

A further embodiment of the foregoing system, wherein the processor is configured to calculate a heating arrangement insulation fault location based on a comparison of the first polarity heating leakage current and the second polarity heating leakage current.

A further embodiment of the foregoing system, wherein the processor is a prediction processor configured to produce a health signal representative of a health of the heating arrangement.

A further embodiment of the foregoing system, wherein the prediction processor is further configured to provide one or more heating arrangement health notifications, each of the one or more heating arrangement health notifications selected from the list consisting of: first polarity heating leakage current, second polarity heating leakage current, first polarity heating arrangement operational hours, second polarity heating arrangement operational hours, total heating arrangement operational hours, remaining first polarity useful heating arrangement life, remaining second polarity useful heating arrangement life, and remaining total useful heating arrangement life.

A further embodiment of the foregoing system, wherein the prediction processor is further configured to provide a history of the one or more heating arrangement health notifications.

A further embodiment of the foregoing system, wherein: the heater is disposed on an aircraft component; the aircraft component is disposed on an external portion of an aircraft; and the heater is configured to control ice formation on the aircraft component.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of monitoring a heating arrangement, the method comprising:
    applying a first polarity DC voltage to a heater of the heating arrangement;
    detecting a first polarity heating leakage current;
    applying a second polarity DC voltage to the heating arrangement;
    detecting a second polarity heating leakage current;
    determining a health of the heating arrangement based on the first polarity heating leakage current and the second polarity heating leakage current;
    generating, via a polarity control circuit, a heater voltage polarity signal indicative of a smaller one of the first polarity heating leakage current and the second polarity heating leakage current; and
    applying to the heater, via a polarity selection circuit and based on the heater voltage polarity signal, either the first polarity heater DC voltage or the second polarity heater DC voltage until a system shutdown, thereby increasing useful life of the heating arrangement.

2. The method of claim 1, further comprising:
    measuring, via a leakage measurement circuit, the first polarity heating leakage current or the second polarity heating leakage current;
    storing, via a processor, the first polarity heating leakage current or the second polarity heating leakage current;
    retrieving, via the processor, a last measured value of the first polarity heating leakage current;
    retrieving, via the processor, a last measured value of the second polarity heating leakage current; and
    comparing, via the processor, the last measured value of the first polarity heating leakage current with the last measured value of the second polarity heating leakage current to determine the heater voltage polarity signal that minimizes the heating leakage current.

3. The method of claim 2, wherein:
    the heater of the heating arrangement comprises:
        a resistive heating element;
        electrical insulation surrounding the resistive heating element; and
        a metallic sheath surrounding the electrical insulation;
    an inlet current flows into the resistive heating element;
    an outlet current flows out of the resistive heating element;
    the heating leakage current flows from the resistive heating element to the metallic sheath; and
    the inlet current is equal to the sum of the outlet current and the heating leakage current.

4. The method of claim 3, further comprising determining, via the leakage current measurement circuit, the heating leakage current by measuring a difference between the inlet current and the outlet current.

5. The method of claim 1, further comprising:
    calculating, via a processor, the first polarity heating leakage current;
    calculating, via the processor, the second polarity heating leakage current;
    calculating, via the processor, a remaining first polarity useful life of the heating arrangement using the first polarity heating leakage current; and
    calculating, via the processor, a remaining second polarity useful life of the heating arrangement using the second polarity heating leakage current.

6. The method of claim 1, wherein generating the heater voltage polarity signal comprises:
    setting the polarity command signal to the first polarity if the second polarity heating leakage current exceeds a threshold value of heating leakage current; and setting the polarity command signal to the second polarity if the first polarity heating leakage current exceeds the threshold value of heating leakage current.

7. The method of claim 5, further comprising balancing, via the processor, a heating arrangement operational time using the first polarity heater DC voltage with the heating arrangement operational time using the second polarity heater DC voltage, thereby extending the useful life of the heating arrangement.

8. The method of claim 5, further comprising providing, via the processor, one or more heater health notifications, each of the one or more heater health notifications selected from the list consisting of: first polarity heating leakage current, second polarity heating leakage current, first polarity heating arrangement operational hours, second polarity heating arrangement operational hours, total heating arrangement operational hours, remaining first polarity useful heating arrangement life, remaining second polarity useful heating arrangement life, and remaining total useful heating arrangement life.

9. A heating arrangement monitoring system comprising:
a leakage current measurement circuit configured to measure a heating leakage current, wherein the heating leakage current is either:
  a first polarity heating leakage current as a result of applying a first polarity DC voltage to the heating arrangement; or
  a second polarity heating leakage current as a result of applying a second polarity DC voltage to the heating arrangement;
a processor, configured to determine a health of the heating arrangement based on one or more measured values of the first polarity heating leakage current and the second polarity heating leakage current;
a polarity selection circuit configured to apply a heater voltage to the heating arrangement using either a first polarity or a second polarity until a system shutdown; and
a polarity control circuit configured to receive a polarity command signal and to direct the polarity selection circuit to apply a selected heater voltage polarity that is either the first polarity or the second polarity;
wherein the processor is configured to:
  calculate the first polarity heating leakage current;
  calculate the second polarity heating leakage current; and
  generate the polarity command signal indicative of a smaller one of the calculated values of the first polarity heating leakage current and the second polarity heating leakage current.

10. The system of claim 9, wherein the processor is further configured to optimize a useful life of the heating arrangement by generating the polarity command signal based on the first polarity heating leakage current and the second polarity heating leakage current by:
setting the polarity command signal to the first polarity if the second polarity heating leakage current exceeds a threshold value of heating leakage current; and
setting the polarity command signal to the second polarity if the first polarity heating leakage current exceeds the threshold value of heating leakage current.

11. The system of claim 9, wherein:
the heating arrangement includes a heater, comprising:
  a resistive heating element;
  electrical insulation surrounding the resistive heating element; and
  a metallic sheath surrounding the electrical insulation;
an inlet current flows into the resistive heating element;
an outlet current flows out of the resistive heating element;
the heating leakage current flows from the resistive heating element to the metallic sheath; and
the heating leakage current is a difference between the inlet current and the outlet current.

12. The system of claim 9, wherein the processor is configured to predict a failure of the heating arrangement based on the measured first polarity heating leakage current, or the measured second polarity heating leakage current, or both.

13. The system of claim 9, wherein the processor is configured to:
calculate a remaining first polarity useful life of the heating arrangement using the first polarity heating leakage current; and
calculate a remaining second polarity useful life of the heating arrangement using the second polarity heating leakage current.

14. The system of claim 9, wherein the processor is configured to calculate a heating arrangement insulation fault location based on a comparison of the first polarity heating leakage current and the second polarity heating leakage current.

15. The system of claim 9, wherein the processor is a prediction processor configured to produce a health signal representative of the health of the heating arrangement.

16. The system of claim 15, wherein the prediction processor is further configured to provide one or more heating arrangement health notifications, each of the one or more heating arrangement health notifications selected from the list consisting of: first polarity heating leakage current, second polarity heating leakage current, first polarity heating arrangement operational hours, second polarity heating arrangement operational hours, total heating arrangement operational hours, remaining first polarity useful heating arrangement life, remaining second polarity useful heating arrangement life, and remaining total useful heating arrangement life.

17. The system of claim 16, wherein the prediction processor is further configured to provide a history of the one or more heating arrangement health notifications.

18. The system of claim 11 wherein:
the heater is disposed on an aircraft component;
the aircraft component is disposed on an external portion of an aircraft; and
the heater is configured to control ice formation on the aircraft component.

* * * * *